United States Patent [19]
[11] 3,808,474
[45] Apr. 30, 1974

Cooke et al.

[54] SEMICONDUCTOR DEVICES

[75] Inventors: Harry F. Cooke, Los Altos Hills, Calif.; Frank E. Emery, Richardson, Tex.

[73] Assignee: Texas Instruments Incorporated, Dallas, Tex.

[22] Filed: Nov. 30, 1972

[21] Appl. No.: 311,016

Related U.S. Application Data

[63] Continuation of Ser. No. 85,060, Oct. 29, 1970, abandoned.

[52] U.S. Cl. .......................... 317/234 R, 317/234 G
[51] Int. Cl. .......................... H01l 5/00
[58] Field of Search .......................... 317/234

[56] References Cited

UNITED STATES PATENTS

| | | | |
|---|---|---|---|
| 3,641,398 | 2/1972 | Fitzgerald | 317/234 |
| 3,479,570 | 11/1969 | Gilbert | 317/234 |
| 3,509,434 | 4/1970 | Yanai et al. | 317/235 |
| 3,577,181 | 5/1971 | Belohoubek | 333/84 |
| 3,626,259 | 12/1971 | Garboushian et al. | 317/234 |

*Primary Examiner*—Rudolph V. Rolinec
*Assistant Examiner*—E. Wojciechowicz
*Attorney, Agent, or Firm*—Harold Levine; James T. Comfort; James O. Dixon

[57] ABSTRACT

A package and mounting suitable for microwave transistors wherein lead inductances are substantially reduced and heat dissipation is improved. A semiconductor substrate having p-n junctions at one of its surfaces has its opposite surface secured to a thermally conductive electrically insulating member on a thermally conductive electrically conductive substrate which acts as the common input to the device. The member is embedded in and partially surrounded by the electrically conductive substrate in a manner that increases the interface surface area of contact between the heat dissipating member and the thermally conductive substrate and shortens the lengths of wire necessary to make connections to the substrate. Parallel connecting paths to each side of the p-n junctions extend in opposite directions over the sides of the semiconductor substrate and are interleaved on each side of the semiconductor substrate to substantially reduce lead inductances by means of the bucking effects of the generated magnetic fields. The electrically conducting substrate has a portion which is positioned intermediate to the input and output leads to the device in a substantially common plane and effectively provides shielding for further reducing lead inductances.

3 Claims, 6 Drawing Figures

INVENTORS
Harry F. Cooke
Frank E. Emery

BY Melvin Sharp
ATTORNEY

SEMICONDUCTOR DEVICES

This is a continuation of application Ser. No. 085,060, filed Oct. 29, 1970, now abandoned.

This invention relates to semiconductor devices and more particularly to packages and mountings for semiconductor substrates, especially suitable for microwave transistors.

In order to enhance the useful gain characteristics of a transistor at microwave frequencies, it is usual to connect the transistor in a common base configuration. The base of the transistor is electrically connected to a conductive heat sink or thermal dissipator which acts as the common connection to the device. The collector of the transistor where the major portion of the heat is generated is mounted so as to be electrically isolated from the heat sink but thermally coupled therewith to provide thermal dissipation from the device. The emitter lead or input to the device and the collector lead or output from the device are arranged in a coplanar configuration. However, two problems associated with such devices are heat dissipation and lead impedances such as lead inductances. For example, the inductances of the base or common lead and connections thereto may cause a decrease in gain of the device, narrow amplifier bandwidth or unstable performance. Also, the mounting of the transistor collector onto the heat sink, the arrangement of the emitter and collector leads, and the connections from the semiconductor substrate to the heat sink and to the collector and emitter leads particularly affect the thermal dissipation characteristic and lead inductances especially at the microwave operating frequencies which in turn affect the quality (Q) and gain performance of the device.

Accordingly, an object of this invention is to minimize the lead impedances, allow lower Q, improve gain performance and improve the thermal dissipation characteristics of the semiconductor device.

The foregoing and other objects, features and advantages of the invention will be apparent from the following detailed description taken in connection with the appended claims and the attached drawings in which:

One aspect of this invention is the interleaving of wire connections on both sides of the semiconductor substrate so that the connection to each side of a p-n junction comprises a plurality of wire connections one extending over one side of the semiconductor substrate and another extending over the other side of the semiconductor substrate. Accordingly, the parallel connecting paths to each side of the p-n junction extend in opposite directions over the sides of the semiconductor substrate which substantially reduces the lead inductances.

Another aspect of this invention is the provision of an electrically and thermally conductive substrate and an electrically insulating heat conductive member embedded in and partially surrounded by the substrate in the manner that contact terminals on the semiconductor substrate mounted on the heat dissipating member can be electrically connected to conductive portions of the substrate by relatively short lengths of wires while increasing the interface surface area of contact between the heat dissipating member and the thermally conductive substrate. Accordingly, the heat dissipative characteristic of the device is enhanced while the wire connection impedances are reduced.

Yet another aspect of this invention is the arrangement of the input, output and common leads so that the common lead is physically and electrically intermediate to the input and output leads in a substantially common plane and effectively provides shielding which further reduces lead inductances.

Figure 1:
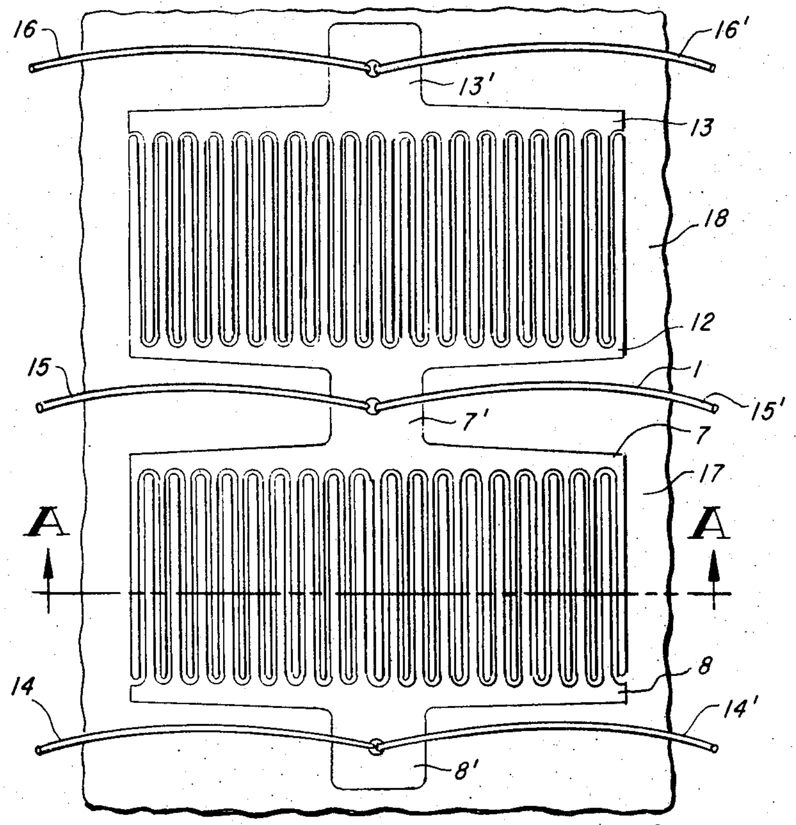
FIG. 1 illustrates a plan view of two cells of a microwave transistor which may be used with the present invention.
Figure 2:
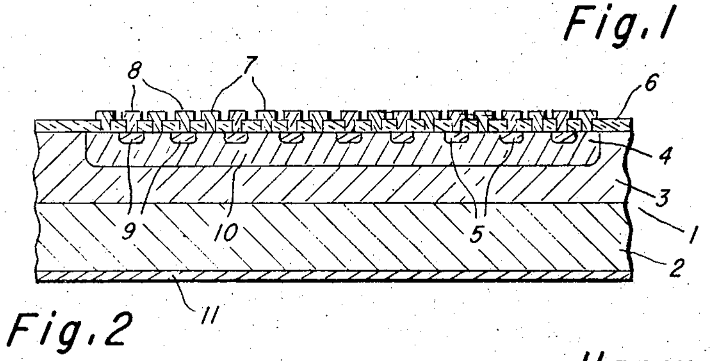
FIG. 2 illustrates a cross-sectional view taken along the line A—A of FIG. 1.

Referring now to the drawings where like reference numerals indicate like parts, FIGS. 1 and 2 illustrate a microwave transistor suitable for mounting and packaging according to the present invention. The transistor comprises the n-type conductivity zone 3 as its collector, the p-type conductivity zone 4 as its base and the n-type conductivity zone 5 as its emitter with the collector-base junction 10 and the emitter-base junction 9 terminating at the top surface of the semiconductor substrate. The high conductivity substrate, zone 2 of N+ conductivity type is formed by the substrate 1 to enhance the ohmic connection to the zone 3 and a thin conductive film 11 may be metallized on the bottom surface. An insulating layer 6, for example silicon dioxide, is provided on the top surface of the semiconductor substrate 1. The ohmic contact 7 connects through openings in the insulating layer 6 to the base zone 4 of the transistor and ohmic contact 8 connects in the same manner to the emitter zone 5 of the transistor. The base contact 7 and the emitter contact 8 are arranged in interdigitated E shapes as can be seen in FIG. 1. The bonding pad 7' connects to the E shaped base contact 7 and the bonding pad 8' connects to the E shaped emitter contact 8. The transistor illustrated in FIGS. 1 and 2 comprises a plurality of identical cells 17 and 18 whereby the base contact 7 of cell 17 extends into the bonding pad 7' and then extends into the base contact 12 of the next cell 18. The emitter contact 13 of cell 18 extends into the bonding pad 13'. In this manner, the base contacts of cells 17 and 18 are connected together at bonding pad 7' while the emitter contacts of the cells 17 and 18 are separated at bonding pads 8' and 13' but a succeeding cell would have its emitter contact connected at bonding pad 13' and a separate bonding pad for its base contact. The number of cells are a matter of choice depending on the intended application and use of the transistor. In any case, a plurality of alternating base and emitter terminal means are located on the insulating layer 6 along the length of the substrate 1. A plurality of wire connections 14–14', 15–15', 16–16' are bonded to each of the terminals 8', 7', 13' respectively for connection to the base and emitter leads of the device. It is noted that each of the wire connections 14–14', 15–15', 16–16' extends in opposite directions over the sides of the substrate 1 from its respective terminal means on the substrate 1. This arrangement provides parallel conduction paths to each of the base and emitter terminals 8', 7', 13' for reducing the lead inductances.

Figure 3:
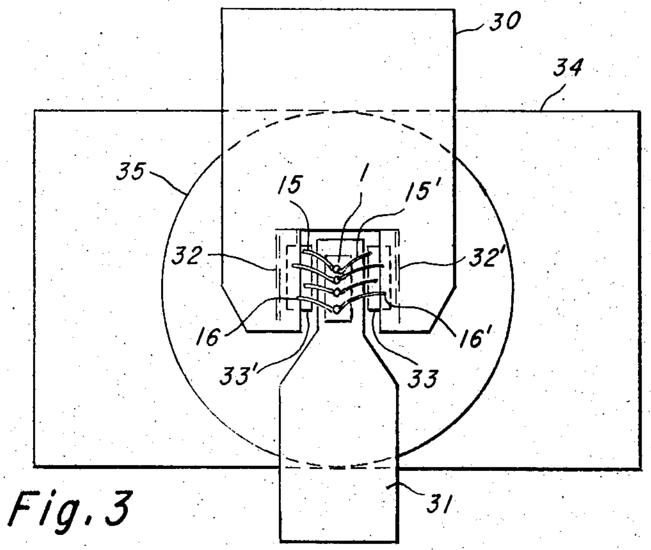
FIG. 3 illustrates a top view of the package mounting according to the present invention.
Figure 4:
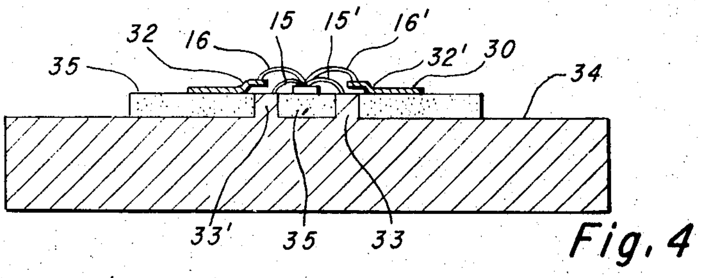
FIG. 4 illustrates a side view of the mounting of FIG. 3.

Referring to FIGS. 3 and 4 wherein a preferred embodiment of the invention is illustrated, the semiconductor body or substrate 1 is secured to a support means comprising an electrically and thermally conductive substrate 34 such as copper and an electrically insulating member 35 having a high thermal conductivity such as berillium oxide. The member 35 is secured on the substrate 34 by means of soldering or brazing. The member 35 has openings or slots therein so that portions 33, 33' of the substrate 34 extend into these openings. The portions 33, 33' serve as connecting points to the base contact of the transistor by means of wires 15, 15'. The portions 33, 33' may be coplanar with the surface of member 35 as illustrated for downward bonding of the wires 15, 15' from terminal means 7' on the semiconductor substrate or the portions 33, 33' may extend above the surface of the member 35 for upward bonding of the wires 15, 15'. The input or emitter lead 30 is provided on the member 35 and comprises a portion extending beyond the periphery of the substrate 34 for external connection to the final package. The emitter lead 30 is split into two fingers or portions 32 and 32' extending on opposite sides of the substrate 1. As can be seen in FIG. 4, the emitter lead 30 comprises a part secured onto the member 35 and raised integral parts 32, 32' extending above the portions 33, 33' respectively. In the event portions 33, 33' are raised above the surface of member 35, parts 32, 32' would be raised accordingly or appropriately offset to accomodate the bonding of the wires 15, 15'. The emitter connections from terminal means 8' or 13' for example, on the substrate 1 are made to the parts 32, 32' by means of the wires 14, 14' and 16, 16'. The output or collector lead 31 comprises a portion extending past the periphery of the substrate 34 for external connection to the final package and comprises a portion secured to the member 35 located underneath the semiconductor substrate 1. The semiconductor substrate 1 has its collector contact 11 alloyed onto the lead 31 so that lead 31 provides an ohmic connection to the collector zone of the transistor.

Wires 15, 15' are electrically connected to the base bonding pad 7' and extend in opposite directions to provide electrical connections respectively to the portions 33, 33'. Similarly the wires 14, 14' and 16, 16' are electrically connected to the emitter bonding pads 8' and 13' and extend in opposite directions to provide electrical connection to portions 32, 32' of the emitter lead 30. In a like manner each of the base and emitter bonding pads of the transistor along the semiconductor substrate has a pair of wires extending in opposite directions to make electrical connection to the common or base connection 34 by means of the portions 33 and 33' and electrical connection to the input or emitter lead 30 by means of the parts 32 and 32'. On each side of the semiconductor substrate, for example, the right hand side, the base and emitter wire 14', 15' are interleaved and make connection to the portions 33 and 32' thereby reducing the base and emitter lead inductances due to the bucking magnetic fields caused by the current flowing in opposite directions in the base and emitter wires and the parallel conduction paths to each of the base and emitter terminal means on both sides of the semiconductor substrate reduces the lead inductances by about 50 percent since the inductance of each wire 15, 15' for example, is reduced in half.

The construction of substrate 34 particularly the portions 33, 33', the member 35 and their relationship with the input, output and common leads provide a number of concurrent advantageous functions. The portions 33, 33' serve as connecting points for the base wires 15, 15' for example, and are located close enough to the semiconductor substrate 1 so that the wires 15, 15' can be made very short. The thermal dissipation characteristic of the device is enchanced since the heat dissipation from the collector of the transistor takes place through the thickness of the member 35 out into the substrate 34 in addition to dissipating heat through the sides of the member 35 into the portions 33, 33' and then into the bulk of substrate 34. In this regard, the semiconductor substrate 1 is mounted on the insulating part 35 which is embedded in and partially surrounded by the electrically conductive heat sink 34 thereby increasing the surface area for thermal dissipation. Moreover, this arrangement results in further reducing lead impedances since portions 33, 33' which would be grounded provide an electrostatic shielding effect between the leads 30 and 31 by reason of the location of 33, 33' intermediate the parts 32, 32' and the portion of lead 31 underneath the substrate 1.

Figure 5:
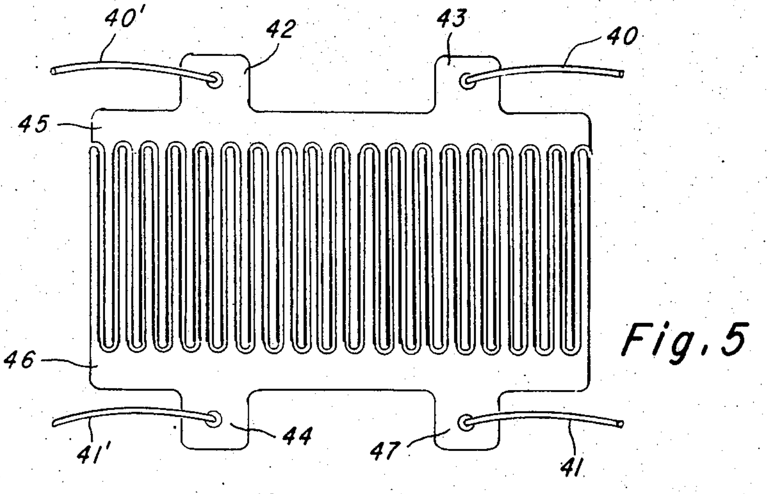
FIG. 5 illustrates the top view of another microwave transistor which may be used with the present invention.

FIG. 5 illustrates the metallization pattern as seen from the top view of another transistor which is suitable for mounting and packaging according to the present invention. Base and emitter contacts 45 and 46 are in the form of interdigitated E shapes. The contact 45 and the contact 46 has a plurality of bonding pads 42, 43, and 44, 47, respectively in lieu of a single bonding pad, for example, as illustrated in FIG. 1, by contact 8 and its bonding pad 8'. Consequently, each contact 45 for example, has a plurality of wires 40, 40' bonded thereto at spaced locations 42, 43 which provides the electrical equivalent of the parallel conduction paths to each side of the p-n junction as illustrated in FIG. 1. Therefore, the terminal means for each side of the p-n junction in FIG. 5 comprises the separated bonding pads 42, 43 for example, and in this manner, the bonding area for each terminal means is increased and functions to provide more uniform current into the fingers of the E shaped contact. However, it is noted that each terminal means as illustrated in FIG. 1 can be located along the center line of the substrate 1 which has the advantage of reducing the collector metal-insulator-semiconductor capacitance, i.e., the capacitances between the base or emitter contacts (7, 8) – insulator (6) – semiconductor (1) to the collector lead 31. Moreover, the symmetrical arrangement of split lead 30, portions 33, 33' and wires 15–15', 16–16' enhances the reduction of lead inductances.

It is noted that the connection of the base and emitter wires 14–14', 15–15', for example, can be interchanged with respect to their connections to lead 30 and conductive portions 33, 33' so that the emitter of the transistor is connected to the conductive substrate 34 and the base of the transistor is connected to lead 30 as the input to the device where common emitter configurations are desired.

Figure 6:
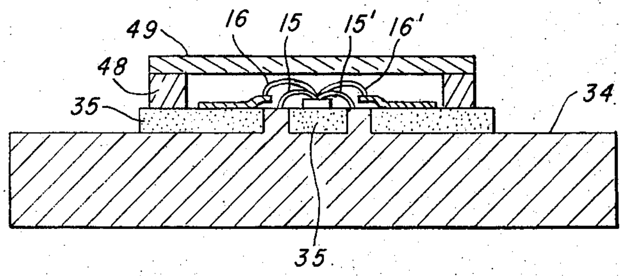
FIG. 6 illustrates a hermetically enclosed transistor according to the present invention.

FIG. 6 illustrates the final hermetically enclosed package. An insulating member such as a ceramic ring 48 is secured onto the member 35 and the cover plate 49 is soldered to the ring 48, all the parts being joined in a conventional manner to hermetically seal the package.

The final package as illustrated in FIG. 6 is in the form of a stud mounted package and accordingly, the copper substrate 34 may comprise a screw thread projection therefrom for mounting purposes.

An example of the fabrication and assembly of a preferred embodiment of the present invention is given below:

The copper substrate 34 may be stamped, coined or milled to the form illustrated in FIGS. 4 and 5. Member 35 may be formed of green or unfired ceramic and fired or formed by drilling with a diamond saw and grinding to form a disc shape with slots therein for insertion of the projections 33', 33 of substrate 34. A metallized pattern is formed on the disc-shaped member 35 by conventional printing technique such as photolithography or silk screening. The metallized pattern corresponds to the leads 30 and 31 projected onto the member 35. The underside of member 35 is coated with metallization by a technique to allow adherence at a high temperature such as 800° C. The two metal leads, 30 and 31, are formed by stamping or etching for example, with the raised portions 32, 32' of lead 30. The parts 34, 35, 30 and 31 are then assembled with solder preforms in a holding fixture and passed through a furnace at the temperature high enough to cause the solder to melt. This temperature is above the temperature at which further assembly operations take place such as the attachment of the semiconductor substrate 1 to the metal lead 31 and the wire bondings 15, 15', 16, 16' for example. Typically, solder melts above 800° C and the further assembly operations are conducted at a lower temperature. With the parts 34, 35, 31 and 30 in place, the leads 30, 31 and projections 33, 33' are plated with gold to facilitate the attachment and bonding and for corrosion resistance. In the given example of a hermetic package as illustrated in FIG. 6, a ceramic ring 48 is fastened to the disc 35 by means of an insulating adhesive such as glass. The substrate 1 as illustrated in FIG. 2 is then fastened to its mounting area on lead 31 as illustrated in FIG. 3 using a suitable solder or alloy process to provide good electrical and thermal conduction to the mounting area on lead 31. Alternatively, the substrate 1 may be mounted onto lead 31 prior to assembly of the parts 34, 35, 30 and 31. The wires 15, 15', 16, 16', 14, 14' are then thermo-compression bonded between the contact pads 13', 7', 8' and conductive portions 32, 32', 33, 33' as illustrated in FIG. 3. The cover plate 49 of metallized ceramic or a metal disc is then soldered to the ring 48 to provide the enclosed device.

It is to be understood that the above described embodiments are merely illustrative of this invention. Numerous other arrangements and techniques may be devised by those skilled in the art without departing from the spirit and scope of the invention.

What is claimed is:

1. A semiconductor device comprising:

a thermally and electrically conductive substrate having a geometrically shaped channel formed therein along one major surface thereof, a thermally conductive electrically insulating member positioned on and secured to said one major surface of said substrate, said insulating member having at least a portion thereof positioned within and filling said geometrically shaped channel so as to be partially surrounded by said substrate with a major surface thereof exposed, a semiconductor body having a first major surface secured to said one major surface of said insulating member, said semiconductor body including contiguous regions therein of opposite conductivity types terminating at a second major surface thereof and defining a p-n junction, the contiguous regions of opposite conductivity types including respective pluralities of spaced apart elongated zones of one conductivity type arranged in alternating relationship with pluralities of elongated zones of the other conductivity type such that successive individual zones included in said contiguous regions are alternately of one conductivity type and then the other conductivity type, a first electrically conductive contact on said second major surface of said semiconductor body connected to one of said regions and provided with a first plurality of fingers overlying the elongated zones thereof, and at least one bonding pad integrally connected to said first plurality of fingers, a second electrically conductive contact on said second major surface of said semiconductor body connected to another of said regions of opposite conductivity type relative to said one region and provided with a second plurality of fingers overlying the elongated zones thereof, and at least one bonding pad integrally connected to said second plurality of fingers, said first and second pluralities of fingers being interlaced with each other so as to be arranged in interdigitated relationship, at least one conductive lead including portions thereof disposed on said one major surface of said insulating member and arranged on opposite sides of said semiconductor body in spaced relation thereto, a first plurality of elongated electrical conductors respectively connected to the bonding pad of one of said first and second electrically conductive contacts and respectively extending over opposite sides of said semiconductor body and electrically connected to respective portions of said electrically conductive substrate partially surrounding said portion of said insulating member disposed within said geometrically shaped channel, and a second plurality of elongated electrical conductors respectively connected to the bonding pad of the other of said first and second electrically conductive contacts and respectively extending over opposite sides of said semiconductor body and electrically connected to said portions of said one conductive lead.

2. A semiconductor device as set forth in claim 1, wherein said first and second pluralities of elongated electrical conductors are arranged such that successive sets of elongated electrical conductors extending over opposite sides of said semiconductor body are alternately from said first and second pluralities of elongated electrical conductors so as to be electrically connected in an alternating sequence to respective portions of said electrically conductive substrate partially surrounding said portion of said insulating member disposed within said geometrically shaped channel and then to said portions of said one conductive lead.

3. A semiconductor device as set forth in claim 1, wherein each of said first and second electrically conductive contacts has a pair of bonding pads integrally connected to said first and second pluralities of fingers respectively and in spaced relation to each other, said first and second pluralities of elongated electrical conductors including respective pairs of elongated electrical conductors each conductor of which is connected to a corresponding one of said pair of bonding pads associated therewith, and the individual elongated electrical conductors of each pair thereof respectively extending over opposite sides of said semiconductor body.

* * * * *